(12) United States Patent
Kouda et al.

(10) Patent No.: US 8,994,098 B2
(45) Date of Patent: Mar. 31, 2015

(54) SEMICONDUCTOR DEVICE INCLUDING PILLAR TRANSISTORS

(71) Applicant: Elpida Memory, Inc., Tokyo (JP)

(72) Inventors: Mitsuki Kouda, Tokyo (JP); Kazuteru Ishizuka, Tokyo (JP); Kiyotaka Endo, Tokyo (JP)

(73) Assignee: PS4 Luxco S.A.R.L., Luxembourg (LU)

( * ) Notice: Subject to any disclaimer, the term of this patent is extended or adjusted under 35 U.S.C. 154(b) by 72 days.

(21) Appl. No.: 13/938,446

(22) Filed: Jul. 10, 2013

(65) Prior Publication Data
US 2014/0015059 A1 Jan. 16, 2014

(30) Foreign Application Priority Data
Jul. 12, 2012 (JP) .................................. 2012-156483

(51) Int. Cl.
| H01L 29/66 | (2006.01) |
| H01L 27/088 | (2006.01) |
| H01L 21/8234 | (2006.01) |
| H01L 27/02 | (2006.01) |
| H01L 27/118 | (2006.01) |

(52) U.S. Cl.
CPC ...... *H01L 27/088* (2013.01); *H01L 21/823487* (2013.01); *H01L 27/0207* (2013.01); *H01L 27/11807* (2013.01)
USPC .......................................... 257/329; 257/368

(58) Field of Classification Search
USPC .................................... 257/329, 368
See application file for complete search history.

(56) References Cited

U.S. PATENT DOCUMENTS

| 2009/0242975 A1* | 10/2009 | Kim et al. ...................... 257/330 |
| 2009/0294833 A1* | 12/2009 | Kim .............................. 257/324 |
| 2010/0025757 A1* | 2/2010 | Son et al. ...................... 257/329 |
| 2011/0220977 A1* | 9/2011 | Yoon et al. .................... 257/296 |

FOREIGN PATENT DOCUMENTS

JP  2011-103339  5/2011

* cited by examiner

*Primary Examiner* — Douglas Menz
(74) *Attorney, Agent, or Firm* — Young & Thompson

(57) ABSTRACT

A first pillar transistor and a second pillar transistor are arranged with no other pillar transistor therebetween, a distance between a first silicon pillar in the first pillar transistor and a second silicon pillar in the second pillar transistor is smaller than a distance between a third silicon pillar in a third pillar transistor and the first silicon pillar.

16 Claims, 9 Drawing Sheets

SILICON PILLAR 11

11
16 SILICON OXIDE FILM
17 SIDEWALL PORTION
15 LOWER N-TYPE DIFFUSION LAYER 11
13 GATE INSULATOR FILM
12 GATE ELECTRODE
15

14 UPPER N-TYPE DIFFUSION LAYER
13
12
11
15

US 8,994,098 B2

SEMICONDUCTOR DEVICE INCLUDING PILLAR TRANSISTORS

This application is based upon and claims the benefit of priority from Japanese patent application No. 2012-156483, filed on Jul. 12, 2012, the disclosure of which is incorporated herein in its entirety by reference. In addition, the disclosure of JP2011-103339A is incorporated herein in its entirety by reference.

BACKGROUND OF THE INVENTION

1. Field of the Invention

The present invention relates to a semiconductor device including a plurality of pillar transistors, and specifically relates to a pillar transistor layout.

2. Description of Related Art

FIGS. 1A and 1B are diagrams illustrating an example of a common semiconductor device: FIG. 1A is a diagram illustrating a logic circuit; and FIG. 1B is a specific circuit diagram.

Examples of semiconductor devices include one that includes two OR gates and one NAND gate as illustrated in FIG. 1A. As illustrated in FIG. 1B, such semiconductor device is provided using a plurality of transistors PM1 to PM4 and NM1 to NM4 connected to the same node.

In recent years, semiconductor devices that use pillar transistors and that include a plurality of transistors have been proposed (see, for example, JP2011-103339A). The pillar transistors enable the integration density of the semiconductor device to be enhanced by using silicon pillars that extend perpendicularly to the principal surface of the semiconductor substrate as channels; however, the area and/or characteristics may vary depending on the layout of the pillar transistors. In particular, in the case of circuit cells in which a plurality of transistors are used, in the same way that standard cells are used, a large difference may occur in chip size.

FIGS. 2A and 2B are diagrams for describing the configuration of a standard cell that employs pillar transistors: FIG. 2A is a diagram illustrating cell rows arranged in a peripheral circuit section next to array sections each including memory cells; and FIG. 2B is a diagram illustrating a configuration of a cell row in a standard cell.

As illustrated in FIG. 2A, in peripheral circuit section 200 of a semiconductor device, cell row 100 is arranged for each array section 300 including memory cells, and in cell row 100, cells each including transistors are arranged.

For example, in a semiconductor device including p-channel pillar transistors and n-channel pillar transistors, as illustrated in FIG. 2B, in each cell row, a p-channel pillar transistor formation region (transistor formation region in a well region in which n-type impurities have been diffused) in which p-channel pillar transistors are formed, and a n-channel pillar transistor formation region (transistor formation region in the well region in which p-type impurities have been diffused), power supply wiring regions and wiring regions for transistors in cells are provided.

Standard cells such as described above provide various combinational circuits by means of input/output wiring combinations. A standard cell enables the degree of freedom of combination to be enhanced by including a plurality of identical transistors, and also enables preventing variation in characteristics depending on the layout of the respective elements.

A layout of pillar transistors will be described below.

FIG. 3 is a circuit diagram illustrating an example of a semiconductor device.

The example illustrated in FIG. 3 includes four transistors M1 to M4, and a case where transistors M1 to M4 are provided using pillar transistors will be considered.

FIGS. 4A, 4B and 4C are diagrams illustrating an example of a structure of a cell where pillar transistors are included in the semiconductor devices illustrated in FIG. 3: FIG. 4A is a top view; FIG. 4B is a cross-sectional view along A-A' indicated in FIG. 4A; and FIG. 4C is a cross-sectional view along B-B' indicated in FIG. 4A.

Where pillar transistors are included in the semiconductor device illustrated in FIG. 3, as illustrated in FIGS. 4A, 4B and 4C, each of pillar transistors M1 to M4 is provided by arranging a plurality of unit pillar transistors 10. In each of unit pillar transistors 10, gate electrode 12 is formed on a side face of silicon pillar 11, which is a pillar section, formed in STI 50, via gate insulator film 13, and upper n-type diffusion layer 14 is formed on the upper portion of silicon pillar 11. Upper n-type diffusion layer 14 is connected to power supply wiring 30 on the surface via through-hole contact 20 formed in STI 50. Also, on the lower portion of silicon pillar 11, lower n-type diffusion layer 15 is formed and p-well 40 is also formed. Gate insulator film 13 and gate electrode 12 are jointly referred to as a sidewall gate electrode.

Each of pillar transistors M1 to M4 includes two pillar rows each including four unit pillar transistors 10 arranged therein. The distance between respective silicon pillars 11 is equal to or smaller than twice the film thickness of gate insulator film 13 and gate electrode 12, whereby gate electrodes 12 are embedded. The two pillar rows included in each of pillar transistors M1 to M4 are arranged in such a manner that a pillar row on the output side (or the power supply side) of a pillar transistor is sandwiched by pillar rows on the power supply side (or the output side) of pillar transistors, in order to avoid occurrence of differences among current paths as indicated by the dotted lines and the alternate long and short dash lines in the Figure, whereby no additional resistance occurs in the respective current paths. More specifically, adjacent to one pillar row of the two pillar rows included in pillar transistor M2, one pillar row of the two pillar rows included in pillar transistor M3 is arranged; adjacent to that pillar row, one pillar row of the two pillar rows included in pillar transistor M1 is arranged; adjacent to that pillar row, one pillar row of the two pillar rows included in pillar transistor M4 is arranged; adjacent to that pillar row, the other pillar row of the two pillar rows included in pillar transistor M2 is arranged; adjacent to that pillar row, the other pillar row of the two pillar rows included in pillar transistor M3 is arranged; adjacent to that pillar row, the other pillar row of the two pillar rows included in pillar transistor M1 is arranged; and adjacent to that pillar row, the other pillar row of the two pillar rows included in pillar transistor M4 is arranged. The distance between silicon pillars 11 of the respective pillar rows is larger than twice the film thickness of gate insulator film 13 and gate electrode 12.

In each of the two pillar rows included in each of pillar transistors M1 to M4, insulator pillar 61 for gate power supply is provided and connected to gate wiring 63 via contact plug 62, whereby pillar rows included in a same pillar transistor are connected to the corresponding one by gate lead wires 70a to 70d.

Lower n-type diffusion layer 15 that are formed on the lower portions of silicon pillars 11 connect respective pillar rows that are adjacent to each other, and below the lower n-type diffusion layer 15, p-well 40 is formed so as to cover all of unit pillar transistors 10.

As described above, if a semiconductor device including pillar transistors arranged therein has an increased number of pillar rows, the area increases. In semiconductor devices, there is a demand for an increase in integration density, and thus, such area increase is not desirable. Furthermore, there is a problem in that a resistance of the lower diffusion layer increases along with the area increase.

SUMMARY

In one exemplary embodiment, there is provided a semiconductor device that includes:

a first pillar transistor including a first diffusion layer on an upper portion of a first silicon pillar formed on a substrate, a second diffusion layer on a lower portion of the first silicon pillar, and a first gate electrode formed via a first gate insulator film so as to cover the surface of the first silicon pillar between the first diffusion layer and the second diffusion layer;

a second pillar transistor including a third diffusion layer on an upper portion of a second silicon pillar formed on the substrate, a fourth diffusion layer on a lower portion of the second silicon pillar, and a second gate electrode formed via a second gate insulator film so as to cover a surface of the second silicon pillar between the third diffusion layer and the fourth diffusion layer;

a third pillar transistor including a fifth diffusion layer on an upper portion of a third silicon pillar formed on the substrate, a sixth diffusion layer formed on a lower portion of the third silicon pillar, and a third gate electrode formed via a third gate insulator film so as to cover a surface of the third silicon pillar between the fifth diffusion layer and the sixth diffusion layer;

a first node to which the first diffusion layer and the third diffusion layer are connected in common and to which the fifth diffusion layer is not connected; and a second node to which the first gate electrode and the second gate electrode are connected in common and to which the third gate electrode is not connected, and the first pillar transistor and the second pillar transistor are arranged with no other pillar transistor therebetween, and a distance between the first silicon pillar and the second silicon pillar is smaller than a distance between the third silicon pillar and the first silicon pillar.

In another exemplary embodiment, there is a semiconductor device that includes:

a first pillar transistor including a plurality of first unit pillar transistors each including a first diffusion layer on an upper portion of a first silicon pillar formed on a substrate, a second diffusion layer on a lower portion of the first silicon pillar, and a first gate electrode formed via a first gate insulator film so as to cover a surface of the first silicon pillar between the first diffusion layer and the second diffusion layer; and a second pillar transistor including a plurality of second unit pillar transistors each including a third diffusion layer on an upper portion of a second silicon pillar formed on the substrate, a fourth diffusion layer on a lower portion of the second silicon pillar, and a second gate electrode formed via a second gate insulator film so as to cover a surface of the second silicon pillar between the third diffusion layer and the fourth diffusion layer, and adjacent first unit pillar transistors from among the plurality of first unit pillar transistors arranged so that there is a first distance between the respective first silicon pillars, and each second silicon pillars in the plurality of second unit pillar transistors and each first silicon pillar in the first unit pillar transistors are arranged so that there is a second distance therebetween, the second distance being larger than the first distance.

In another exemplary embodiment, there is a semiconductor device that includes:

a first pillar transistor including a plurality of first unit pillar transistors each including a first diffusion layer on an upper portion of a first silicon pillar formed on a substrate, a second diffusion layer on a lower portion of the first silicon pillar, and a first gate electrode formed via a first gate insulator film so as to cover a surface of the first silicon pillar between the first diffusion layer and the second diffusion layer, each first diffusion layers being connected to a first node, each first gate electrodes being connected to each other at a same layer with no other wiring therebetween, and a distance between silicon pillars of adjacent two first unit pillar transistors from among the plurality of first unit pillar transistors being equal to or smaller than twice the thickness of the first gate electrode.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Semiconductor devices according to preferred embodiments of the present invention will be described in detail below with reference to the drawings.

First Exemplary Embodiment

Figure 5A:
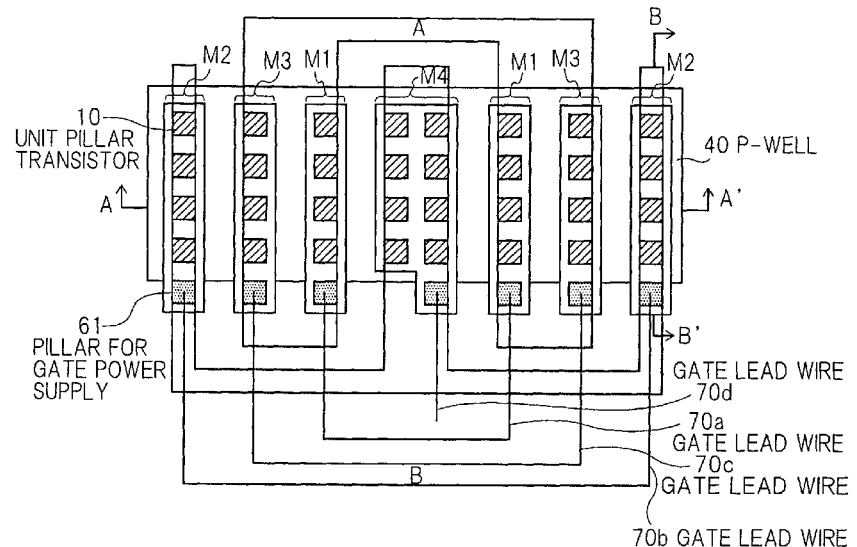
FIG. 5A is a top view of a structure of a first exemplary embodiment of a semiconductor device according to the present invention.
Figure 5B:
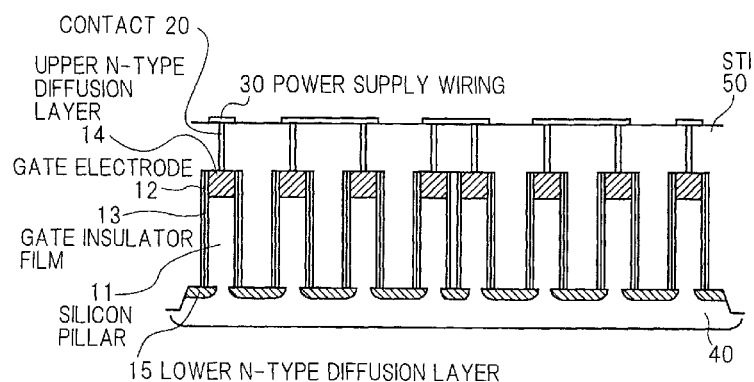
FIG. 5B is a cross-sectional view along A-A' indicated in FIG. 5A.
Figure 5C:
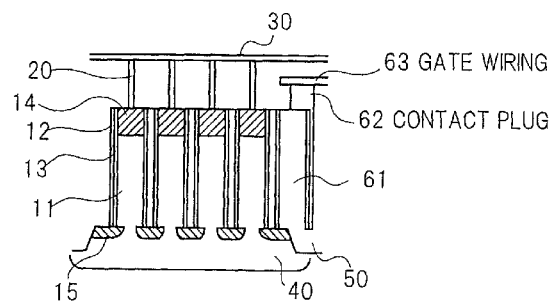
FIG. 5C is a cross-sectional view along B-B' indicated in FIG. 5A.

FIGS. 5A, 5B and 5C are diagrams illustrating the structure of a first exemplary embodiment of a semiconductor device according to the present invention: FIG. 5A is a top view; FIG. 5B is a cross-sectional view along A-A' indicated in FIG. 5A, and FIG. 5C is a cross-sectional view along B-B' indicated in FIG. 5A.

Figure 1A:
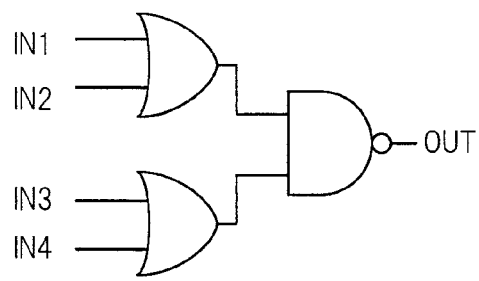
FIG. 1A is a diagram illustrating a logic circuit, which is a common semiconductor device.
Figure 1B:
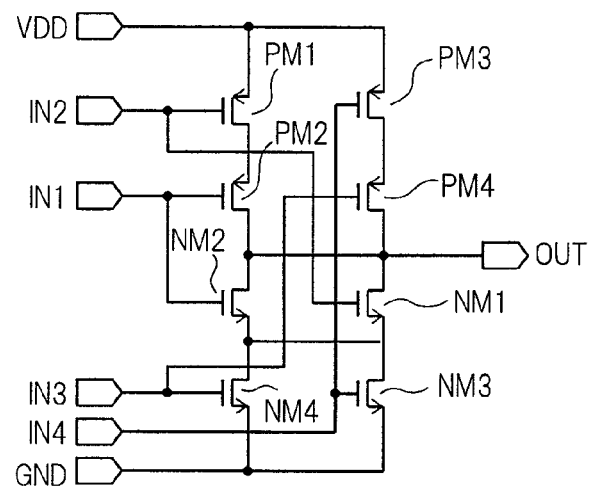
FIG. 1B is a circuit diagram illustrating an example of the logic circuit illustrated in FIG. 1A.
Figure 2A:
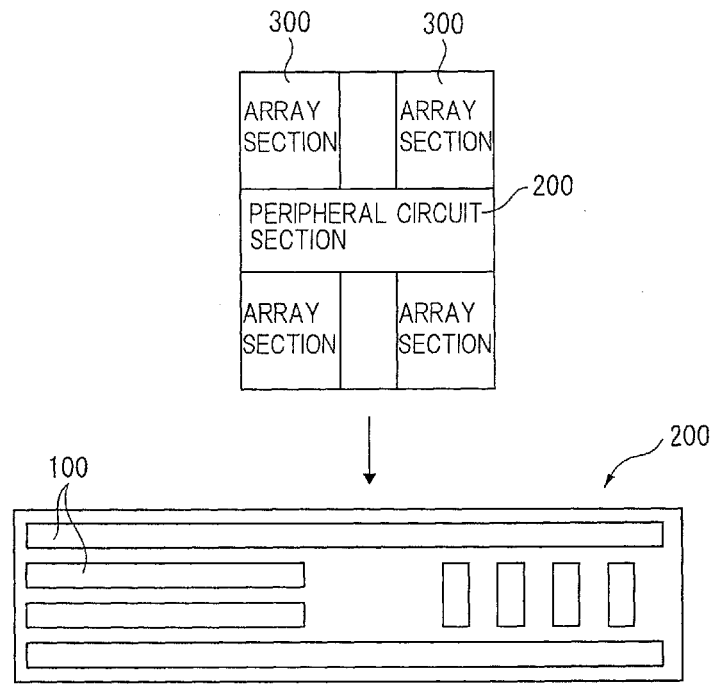
FIG. 2A is a diagram illustrating cell rows arranged in a peripheral circuit section next to array sections each including memory cells.
Figure 2B:
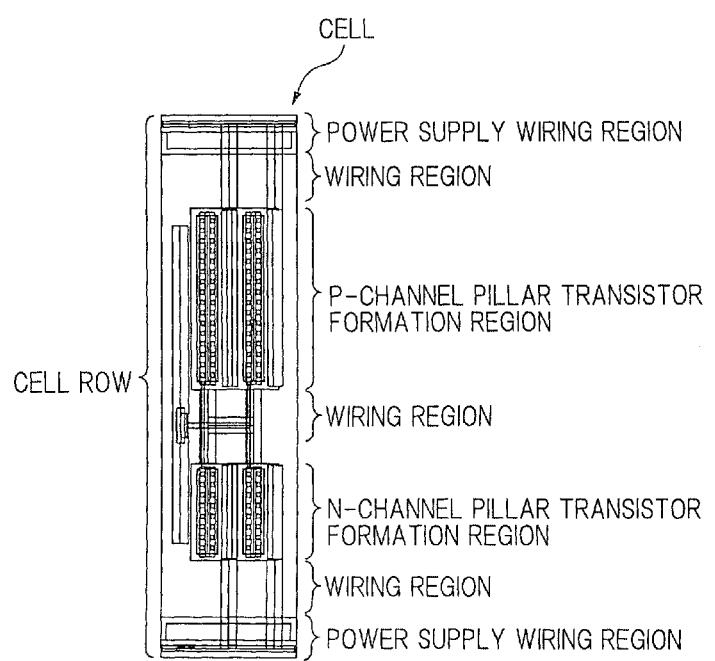
FIG. 2B is a diagram illustrating a configuration of a cell row in a standard cell.
Figure 3:
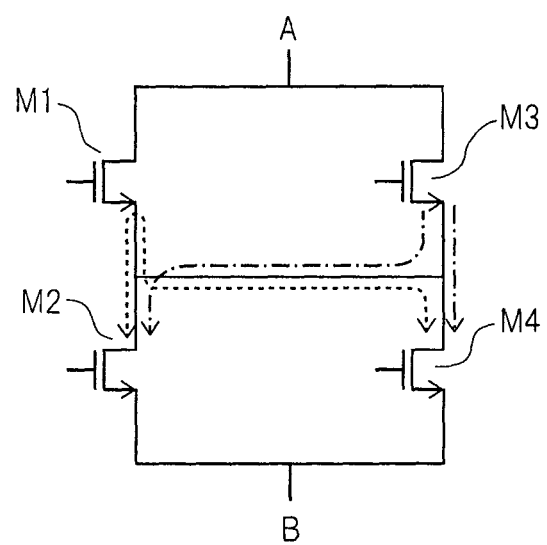
FIG. 3 is a circuit diagram illustrating an example of a semiconductor device.

The present exemplary embodiment includes a structure obtained by applying the present invention to one provided by using pillar transistors in the semiconductor device illustrated in FIG. 3. Therefore, as with the one illustrated in FIGS. 4A, 4B and 4C, each of pillar transistors M1 to M4 includes a plurality of unit pillar transistors 10 aligned therein, and each unit pillar transistor 10 includes a structure similar to that illustrated in FIGS. 4A, 4B and 4C. Furthermore, in each of pillar rows including four unit pillar transistors 10 aligned therein, as with the one illustrated in FIGS. 4A, 4B and 4C, insulator pillar 61 for gate power supply is provided and connected to gate wiring 63 via contact plug 62, whereby pillar rows included in the same pillar transistor are connected to the corresponding one by gate lead wires 70a to 70d.

Figure 4A:
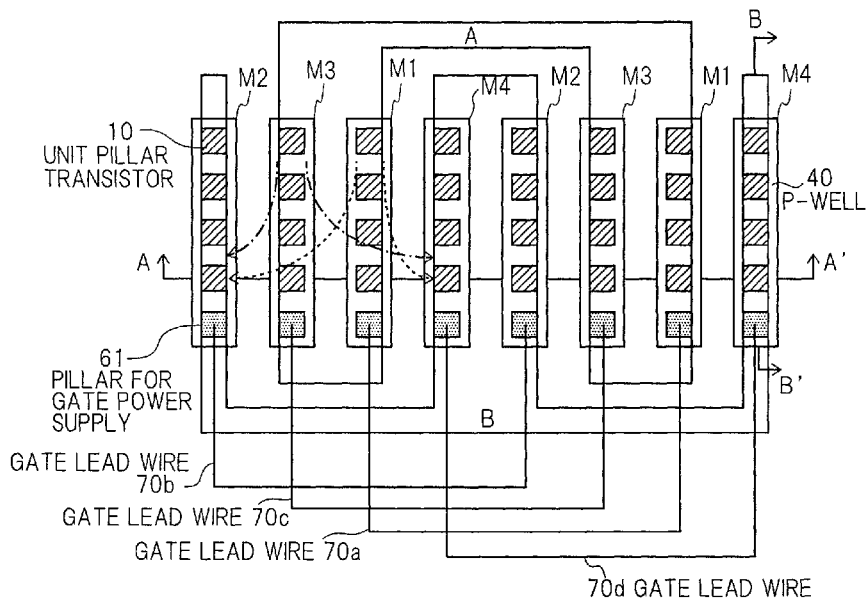
FIG. 4A is a top view illustrating an example of a structure of one cell where the semiconductor device illustrated in FIG. 3 is provided using pillar transistors.
Figure 4B:
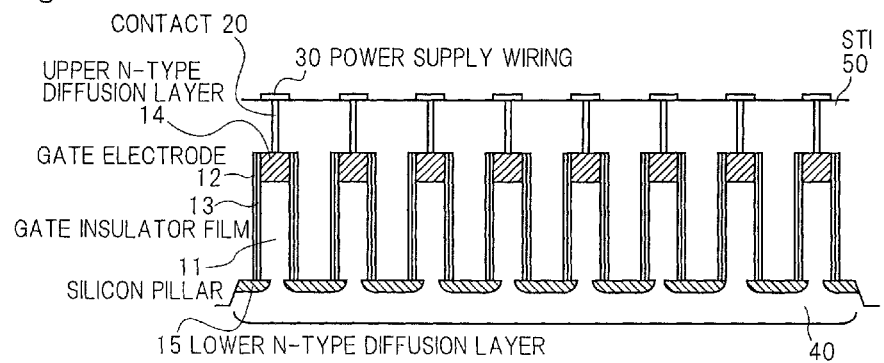
FIG. 4B is a cross-sectional view along A-A' indicated in FIG. 4A.
Figure 4C:
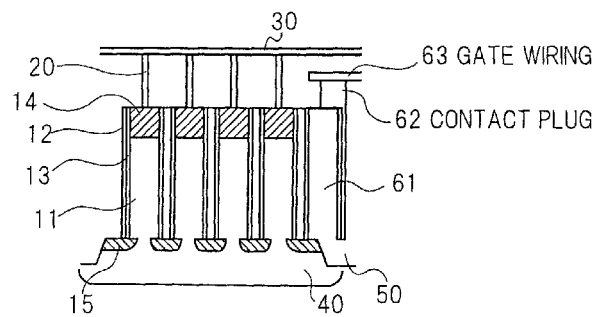
FIG. 4C is a cross-sectional view along B-B' indicated in FIG. 4A.

The present exemplary embodiment is different from the one illustrated in FIGS. 4A, 4B and 4C in the layout of pillar rows. The distance between respective silicon pillars 11 in pillar rows in pillar transistor M4 from among pillar transistors M1 to M4 is equal to or smaller than twice the film thickness of the sidewall gate electrode. This configuration is achieved by using the concept that the space between respective unit pillar transistors included in pillar transistors in the same pillar transistor may be filled with sidewall gate electrodes. Furthermore, as described above, the distance between silicon pillars 11 of unit pillar transistors 10 included in each pillar row is equal to or smaller than twice the film thickness of the sidewall gate electrode, and accordingly, the distance between respective silicon pillars 11 in all of unit pillar transistors 10 included in pillar transistor M4 is equal to or smaller than twice the film thickness of the sidewall gate electrode.

Furthermore, as with the semiconductor device illustrated in FIGS. 4A, 4B and 4C, two pillar rows are provided in each of other pillar transistors M1 to M3: the pillar rows in each of pillar transistors M1 to M3 are arranged symmetrically with the pillar rows in pillar transistor M4 in the center. More specifically, the pillar rows in pillar transistor M1 are arranged so as to sandwich the pillar rows in pillar transistor M4; on the respective sides of the pillar rows in pillar transistor M1 opposite to the pillar rows in pillar transistor M4, the pillar rows in pillar transistor M3 are arranged; and on the respective sides of pillar rows in pillar transistor M3 opposite to the pillar rows in pillar transistor M1, the pillar rows in pillar transistor M2 are arranged.

Lower n-type diffusion layer 15 that are formed on lower portions of silicon pillars 11 connect the respective pillar rows that are arranged in such a manner as described above, and below lower n-type diffusion layer 15, p-well 40 is formed so as to cover all of unit pillar transistors 10.

A method for forming gate electrodes 12 described above will be described below.

FIGS. 6A, 6B, 6C and 6D are diagrams for describing a method for forming gate electrodes 12 in the semiconductor device illustrated in FIGS. 5A, 5B and 5C.

Figure 6A:
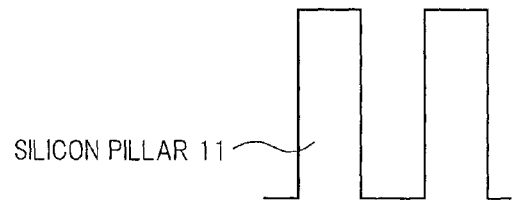
FIG. 6A is a diagram for describing a method for forming gate electrodes in the semiconductor device illustrated in FIGS. 5A to 5C.
Figure 6B:
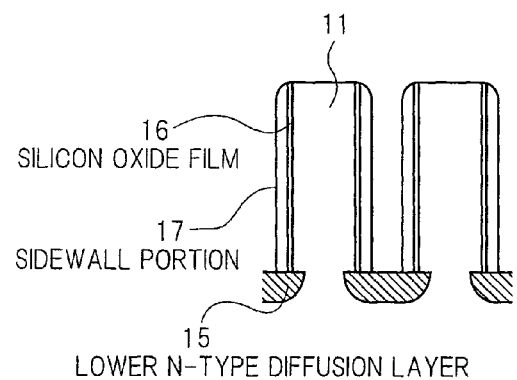
FIG. 6B is a diagram for describing a method for forming gate electrodes in the semiconductor device illustrated in FIGS. 5A to 5C.

When forming gate electrodes 12 in the semiconductor device illustrated in FIGS. 5A, 5B and 5C, first, side faces of silicon pillars 11 (FIG. 6A) that are formed by etching are oxidized to form silicon oxide film 16, and sidewall portion 17 is formed on silicon oxide film 16 by a silicon nitride film. Furthermore, impurities are injected to the proximal end side of silicon pillars 11 to form lower n-type diffusion layer 14 (FIG. 6B).

Figure 6C:
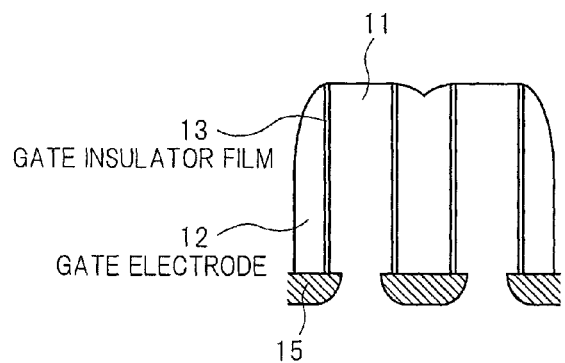
FIG. 6C is a diagram for describing a method for forming gate electrodes in the semiconductor device illustrated in FIGS. 5A to 5C.

Next, sidewall portion 17, which includes a silicon nitride film, and silicon oxide film 16 are wet-etched to form gate insulator film 13 having a thickness of several nanometers on the side faces of silicon pillars 11. Then, using a gate electrode material, a substantially-cylindrical gate electrode 12 is formed on each of side faces of silicon pillars 11 so as to cover gate insulator film 13 (FIG. 6C). In this case, spaces between respective pillar rows in pillar transistor M4 are filled with gate electrodes 12.

Figure 6D:
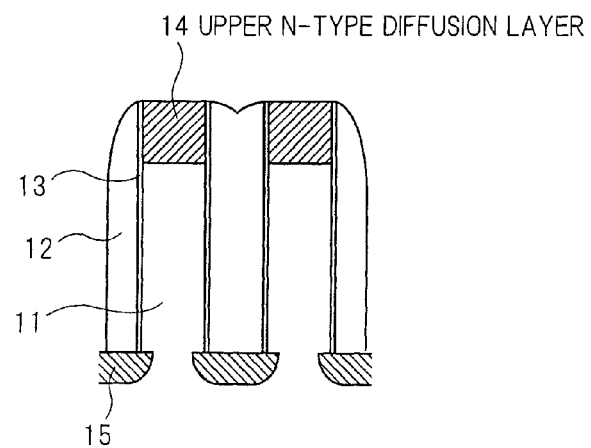
FIG. 6D is a diagram for describing a method for forming gate electrodes in the semiconductor device illustrated in FIGS. 5A to 5C.

Subsequently, silicon is selectively epitaxially grown on upper portions of silicon pillars 11, and then impurities are injected to the epitaxially-grown silicon to form upper n-type diffusion layer 14 (FIG. 6D).

Effects of the semiconductor device according to the present exemplary embodiment will be described below.

In the semiconductor device configured as described above, the distance between respective silicon pillars 11 in the pillar rows in pillar transistor M4 from among pillar transistors M1 to M4 is equal to or smaller than twice the film thickness of the sidewall gate electrode, whereby the distance between respective silicon pillars 11 in all of unit pillar transistors 10 included in pillar transistor M4 is equal to or smaller than twice the film thickness of the sidewall gate electrode, enabling reduction in area compared to the semiconductor device illustrated in FIGS. 4A, 4B and 4C. For example, where 1000 cells are used in one chip, if an area of 1 $\mu m^2$ can be reduced per cell, an area of 1 $mm^2$ can be reduced in the entire chip. Furthermore, along with the reduction, the area of lower n-type diffusion layer 15 is also reduced, enabling a decrease in resistance value thereof and a side face capacity that can be designed to be small.

Also, in the semiconductor device illustrated in FIGS. 4A, 4B and 4C, a pillar row on the output side (or the power supply side) of a pillar transistor is arranged in such a manner that the pillar row is sandwiched by pillar rows on the power supply sides (or the output sides) of pillar transistors, resulting in complexity in the installation of gate lead wires 70a to 70d. In contrast, in the present exemplary embodiment, the pillar rows in each of pillar transistors M1 to M3 are arranged symmetrically with the pillar rows in pillar transistor M4 in the center, whereby complexity in installation of gate lead wires 70a to 70d is prevented.

Second Exemplary Embodiment

Figure 7A:
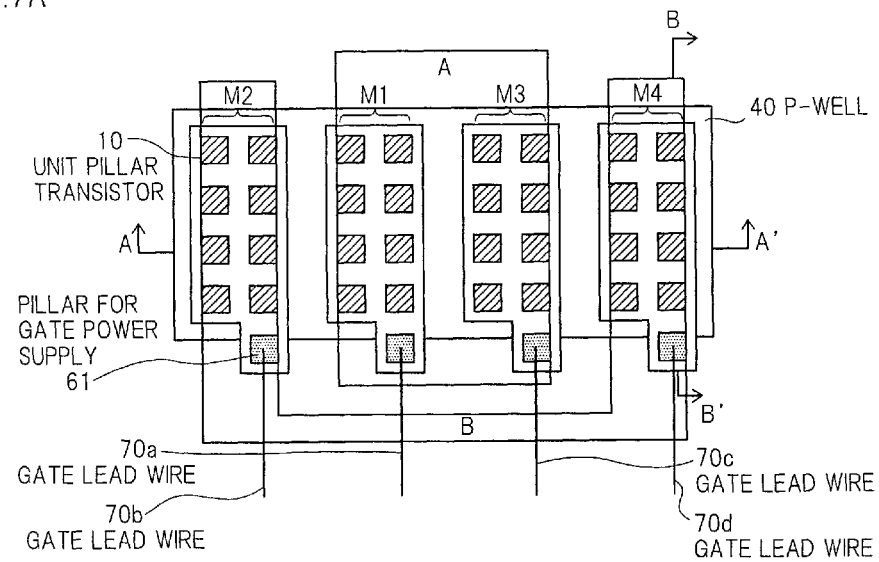
FIG. 7A is a top view of a structure of a second exemplary embodiment of a semiconductor device according to the present invention.
Figure 7B:
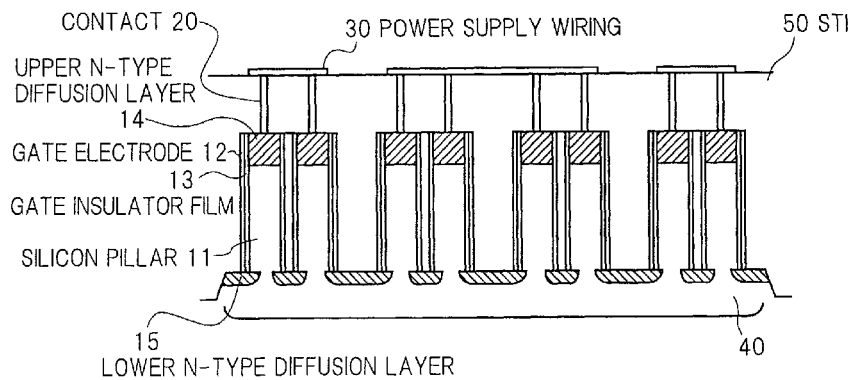
FIG. 7B is a cross-sectional view along A-A' indicated in FIG. 7A.
Figure 7C:
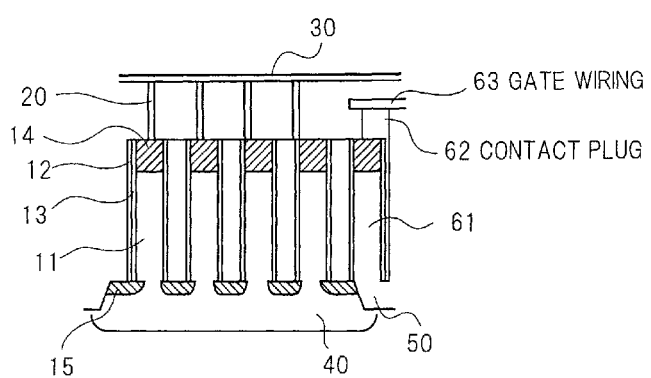
FIG. 7C is a cross-sectional view along B-B' indicated in FIG. 7A.

FIGS. 7A, 7B and 7C are diagrams illustrating the structure of a second exemplary embodiment of the semiconductor device according to the present invention: FIG. 7A is a top view; FIG. 7B is a cross-sectional view along A-A' indicated in FIG. 7A; and FIG. 7C is a cross-sectional view along B-B' indicated in FIG. 7A.

As illustrated in FIGS. 7A, 7B and 7C, the present exemplary embodiment is different from the one illustrated in FIGS. 5A, 5B and 5C in that two pillar rows in each of all of pillar transistors M1 to M4 are arranged adjacent to each other, and the distance between respective silicon pillars 11 in the two pillar rows that are arranged adjacent to each other is equal to or smaller than twice the film thickness of the sidewall gate electrode. Consequently, in each of all of pillar transistors M1 to M4, the distance between respective silicon pillars 11 in unit pillar transistors that are included in the same pillar transistor is equal to or smaller than twice the film thickness of the sidewall gate electrode and the distance between respective silicon pillars 11 in unit pillar transistors that are included in different pillar transistors is larger than twice the film thickness of the sidewall gate electrode.

Here, assuming that a is a distance between silicon pillars 11 in unit pillar transistors 10 included in the same pillar transistor and b is the distance between silicon pillars 11 in unit pillar transistors 10 included in different pillar transistors (b>a), the semiconductor device according to the present exemplary embodiment will be compared with the semiconductor device illustrated in FIGS. 4A, 4B and 4C.

In the semiconductor device illustrated in FIGS. 4A, 4B and 4C, the distance between silicon pillar 11 in the pillar row in pillar transistor M2 arranged in the left end in the Figure and silicon pillar 11 in the pillar row in pillar transistor M4 arranged in the right end in the Figure is 7b if diameters of the unit pillar transistors interposed therebetween are not taken into account.

Meanwhile, in the semiconductor device according to the present exemplary embodiment, the distance between silicon pillar 11 in the pillar row in pillar transistor M2 arranged in the left end in the Figure and silicon pillar 11 in the pillar row in pillar transistor M4 arranged in the right end in the Figure is 4a+3b.

In other words, in the semiconductor device according to the present exemplary embodiment, the distance between silicon pillars 11 in the pillar rows arranged in the opposite ends has been reduced by 4×(b−a) compared to the semiconductor device illustrated in FIGS. 4A, 4B and 4C. The difference in distance directly reflects the difference in area, and thus, the area can be reduced, and along with the reduction in area, the area of lower n-type diffusion layer 15 is reduced, enabling a decrease in resistance value thereof.

Furthermore, the two pillar rows in each of pillar transistors M1 to M4 are arranged adjacent to each other, eliminating the need to connect gate power supply pillars 61 via gate lead wires 70a to 70d.

Third Exemplary Embodiment

Figure 8:
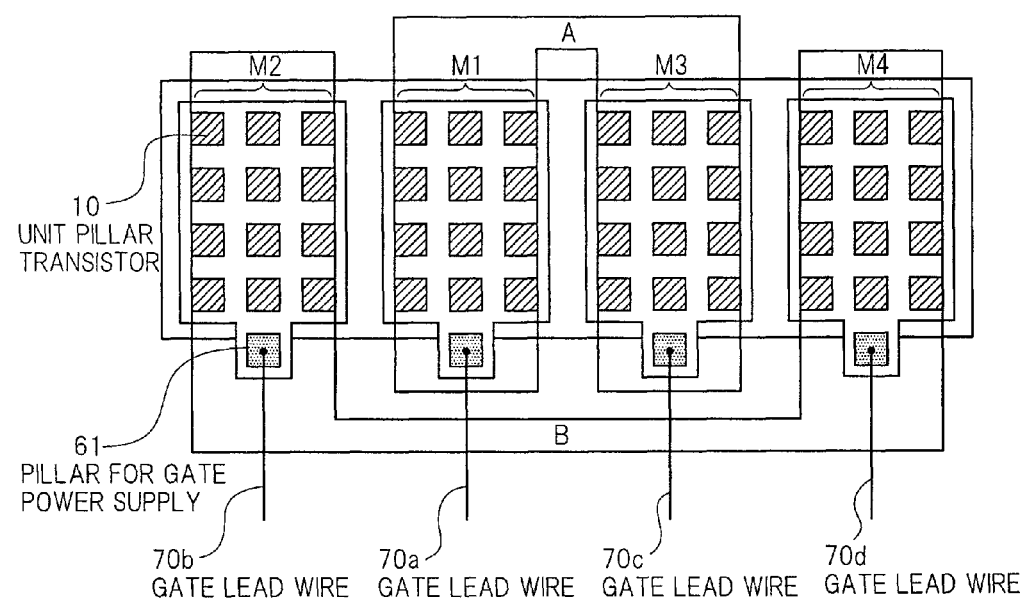
FIG. 8 is a top view illustrating a structure of a third exemplary embodiment of a semiconductor device according to the present invention.

FIG. 8 is a top view illustrating the third exemplary embodiment of a semiconductor device according to the present invention.

As illustrated in FIG. 8, the present exemplary embodiment is different from the one illustrated in FIGS. 7A, 7B and 7C in that three pillar rows each including unit pillar transistors 10 aligned therein are provided for each of pillar transistors M1 to M4.

Semiconductor device that uses pillar transistors including a larger number of pillar rows, as in the present exemplary embodiment, has a larger difference in area from the semiconductor device illustrated in FIGS. 4A, 4B and 4C in which the distance between silicon pillars 11 in pillar rows is larger than twice the sidewall gate electrode, and thus enhances the above-described effects.

Fourth Exemplary Embodiment

Figure 9A:
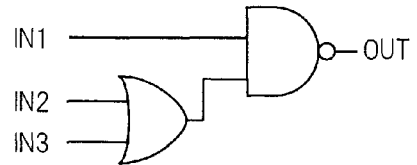
FIG. 9A is a diagram illustrating a logic circuit of a fourth exemplary embodiment of a semiconductor device according to the present invention.
Figure 9B:
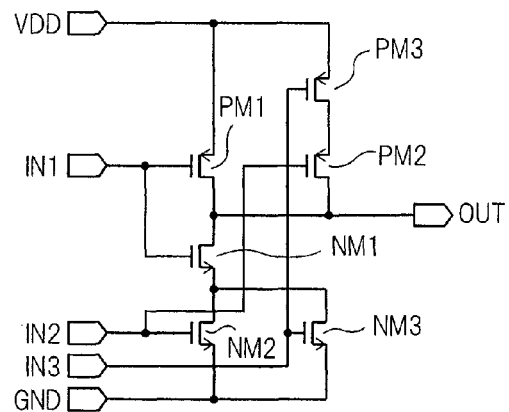
FIG. 9B is a circuit diagram illustrating an example of the logic circuit illustrated in FIG. 9A.
Figure 9C:
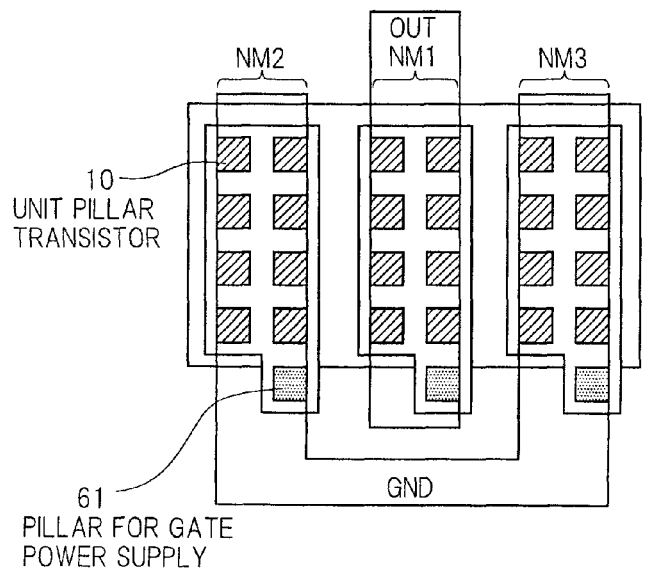
FIG. 9C is a top view illustrating structures of three n-type transistors illustrated in FIG. 9B.

FIGS. 9A, 9B and 9C are diagrams illustrating a fourth exemplary embodiment of a semiconductor device according to the present invention: FIG. 9A is a diagram illustrating a logic circuit; FIG. 9B is a specific circuit diagram; and FIG. 9C is a top view illustrating structures of three n-type transistors NM1 to NM3 illustrated in FIG. 9B.

As illustrated in FIGS. 9A, 9B and 9C, the present exemplary embodiment includes three p-channel transistors PM1 to PM3 and three n-channel transistors NM1 to NM3 to provide a logic circuit including one NOR gate and one NAND gate.

Here, although each of transistors PM1 to PM3 and NM1 to NM3 has a structure similar to those of the pillar transistors in the above-described exemplary embodiments, the feature of the present exemplary embodiment is the transistor layout in which transistor NM1 is a first pillar transistor, transistor NM2 is a second pillar transistor, and transistor NM3 is a third pillar transistor.

While in transistors NM1 to NM3, as illustrated in FIG. 9B, current that flows in transistor NM1 is supplied to transistors NM2 and NM3, as illustrated in FIG. 9C, unit pillar transistors 10 included in transistor NM1 is arranged so as to be sandwiched by unit pillar transistors 10 included in transistor NM2 and unit pillar transistors 10 included in transistor NM3.

Such a configuration enables a decrease in resistance of lower n-type diffusion layer 15.

It is apparent that the present invention is not limited to the above embodiments, but may be modified and changed without departing from the scope and spirit of the invention.

What is claimed is:
1. A semiconductor device comprising:
a first pillar transistor including a first diffusion layer on an upper portion of a first silicon pillar formed on a substrate, a second diffusion layer on a lower portion of the first silicon pillar, and a first gate electrode formed via a first gate insulator film so as to cover a surface of the first silicon pillar between the first diffusion layer and the second diffusion layer;
a second pillar transistor including a third diffusion layer on an upper portion of a second silicon pillar formed on the substrate, a fourth diffusion layer on a lower portion of the second silicon pillar, and a second gate electrode formed via a second gate insulator film so as to cover a surface of the second silicon pillar between the third diffusion layer and the fourth diffusion layer;
a third pillar transistor including a fifth diffusion layer on an upper portion of a third silicon pillar formed on the substrate, a sixth diffusion layer formed on a lower portion of the third silicon pillar, and a third gate electrode formed via a third gate insulator film so as to cover a surface of the third silicon pillar between the fifth diffusion layer and the sixth diffusion layer;

a first node to which the first diffusion layer and the third diffusion layer are connected in common and to which the fifth diffusion layer is not connected; and a second node to which the first gate electrode and the second gate electrode are connected in common and to which the third gate electrode is not connected, wherein the first pillar transistor and the second pillar transistor are arranged with no other pillar transistor therebetween, and a distance between the first silicon pillar and the second silicon pillar is smaller than a distance between the third silicon pillar and the first silicon pillar.

2. The semiconductor device according to claim 1, wherein the first, the second and the third pillar transistors are arranged on a same straight line.

3. The semiconductor device according to claim 1, wherein the first and the second pillar transistors are arranged on a first straight line, and the first and the third pillar transistor are arranged on a second straight line crossing the first straight line.

4. The semiconductor device according to claim 1, wherein the first gate electrode and the second gate electrode are connected via a wiring of a same layer, with no wiring of another layer therebetween.

5. The semiconductor device according to claim 1, wherein the first, the second and the third pillar transistors are arranged in a well formed on the substrate.

6. A semiconductor device comprising:
a first pillar transistor including a plurality of first unit pillar transistors each including a first diffusion layer on an upper portion of a first silicon pillar formed on a substrate, a second diffusion layer on a lower portion of the first silicon pillar, and a first gate electrode formed via a first gate insulator film so as to cover a surface of the first silicon pillar between the first diffusion layer and the second diffusion layer; and
a second pillar transistor including a plurality of second unit pillar transistors each including a third diffusion layer on an upper portion of a second silicon pillar formed on the substrate, a fourth diffusion layer on a lower portion of the second silicon pillar, and a second gate electrode formed via a second gate insulator film so as to cover a surface of the second silicon pillar between the third diffusion layer and the fourth diffusion layer,
wherein adjacent first unit pillar transistors from among the plurality of first unit pillar transistors are arranged so that there is a first distance between the first silicon pillars, and each second silicon pillar in the plurality of second unit pillar transistors and each first silicon pillar in the first unit pillar transistors are arranged so that there is a second distance therebetween, the second distance being larger than the first distance.

7. The semiconductor device according to claim 6, wherein the plurality of first unit pillar transistors are arranged so that a plurality of the first unit pillar transistors are arranged in a first direction and a plurality of the first unit pillar transistors are arranged in a second direction crossing the first direction.

8. The semiconductor device according to claim 7, wherein at least a plurality of the second unit pillar transistors are arranged in the second direction.

9. The semiconductor device according to claim 6, wherein each first gate electrode in the plurality of first unit pillar transistor is formed at a same layer.

10. The semiconductor device according to claim 7, wherein the plurality of the second unit pillar transistors are arranged so that a plurality of the second unit pillar transistors are arranged in the first direction and a plurality of the second unit pillar transistors are arranged in the second direction.

11. A semiconductor device comprising a first pillar transistor including a plurality of first unit pillar transistors each including a first diffusion layer on an upper portion of a first silicon pillar formed on a substrate, a second diffusion layer on a lower portion of the first silicon pillar, and a first gate electrode formed via a first gate insulator film so as to cover a surface of the first silicon pillar between the first diffusion layer and the second diffusion layer, each first diffusion layer being connected to a first node, each first gate electrode being connected to each other at a same layer with no other wiring therebetween, wherein a distance between silicon pillars of adjacent two first unit pillar transistors from among the plurality of first unit pillar transistors is equal to or smaller than twice the thickness of the first gate electrode.

12. The semiconductor device according to claim 11, wherein a direction of the thickness of the first gate electrode is a direction crossing a direction of a height of the silicon pillar.

13. The semiconductor device according to claim 11, further comprising a second pillar transistor including a plurality of second unit pillar transistors each including a third diffusion layer on an upper portion of a second silicon pillar formed on the substrate, a fourth diffusion layer on a lower portion of the second silicon pillar, and a second gate electrode formed via a second gate insulator film so as to cover a surface of the second silicon pillar between the third diffusion layer and the fourth diffusion layer, wherein each second silicon pillar in the plurality of second unit pillar transistors is a distance away from each first silicon pillar in the plurality of first unit pillar transistors, the distance being larger than twice the thickness of the first gate electrode.

14. The semiconductor device according to claim 11, further comprising a second pillar transistor including a plurality of second unit pillar transistors each including a third diffusion layer on an upper portion of a second silicon pillar formed on the substrate, a fourth diffusion layer on a lower portion of the second silicon pillar, and a second gate electrode formed via a second gate insulator film so as to cover a surface of the second silicon pillar between the third diffusion layer and the fourth diffusion layer, wherein a distance between silicon pillars of adjacent two second unit pillar transistors from among the plurality of second unit pillar transistors is equal to or smaller than twice the thickness of the second gate electrode.

15. The semiconductor device according to claim 11, comprising a second pillar transistor including a plurality of second pillar transistors each including a third diffusion layer on an upper portion of a second silicon pillar formed on the substrate, a fourth diffusion layer on a lower portion of the second silicon pillar, and a second gate electrode formed via a second gate insulator film so as to cover a surface of the second silicon pillar between the third diffusion layer and the fourth diffusion layer, wherein an insulator is provided between the first pillar transistor and the second pillar transistor.

16. The semiconductor device according to claim 15, wherein the insulator is provided in a region sandwiched by the first gate electrode and the second gate electrode.

\* \* \* \* \*